United States Patent [19]

Luscher

[11] 4,314,161
[45] Feb. 2, 1982

[54] INTEGRATED SHIFT REGISTER

[75] Inventor: Jacob Luscher, Venthone, Switzerland

[73] Assignee: Ebauches S.A., Switzerland

[21] Appl. No.: 53,405

[22] Filed: Jun. 29, 1979

[30] Foreign Application Priority Data

Jul. 6, 1978 [FR] France .............................. 78 20163
Jul. 6, 1978 [FR] France .............................. 78 20164

[51] Int. Cl.³ ............................................ G11C 19/28
[52] U.S. Cl. ............................... 307/221 C; 307/304; 307/571; 357/41; 357/51
[58] Field of Search ............ 307/205, 221 R, 221 C, 307/251, 279, 304; 357/41, 51

[56] References Cited

U.S. PATENT DOCUMENTS 3,808,458  4/1974  Mundy et al. .................. 307/221 C
3,937,984  2/1976  Fry .................................. 307/221 C Primary Examiner—Eugene La Roche
Attorney, Agent, or Firm—Allegretti, Newitt, Witcoff & McAndrews

[57] ABSTRACT

The shift register has a very low power consumption. Each cell of the shift register has two stages, each comprising an MOS structure ($T_1-T'_1$) which has two principal electrodes ($Z_{00}$, $Z_1$) respectively forming the input ($Z_{oo}$) and the output ($Z_1$) of the stage, and two control electrodes ($k_1$, $k'_1$) one of which ($k_1$) can be connected to a bias source (P) and the other of which ($k'_1$) is connected to the output electrode ($Z_1$), and a capacitor ($C_1$), one plate ($Z_1$) of which is connected to the said output electrode ($Z_1$) and the other plate ($C_1$) of which receives one of two periodic signals $\phi_1(t)$ and $\phi_2(t)$ in phase opposition. The register is especially useful in a frequency divider circuit.

6 Claims, 3 Drawing Figures

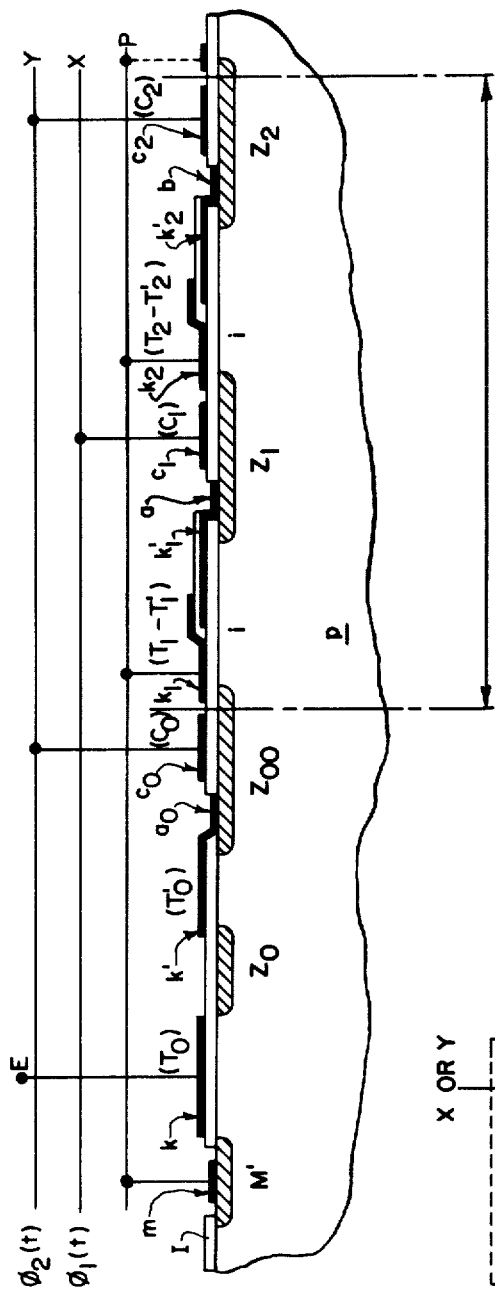
FIG. 1
FIG. 3
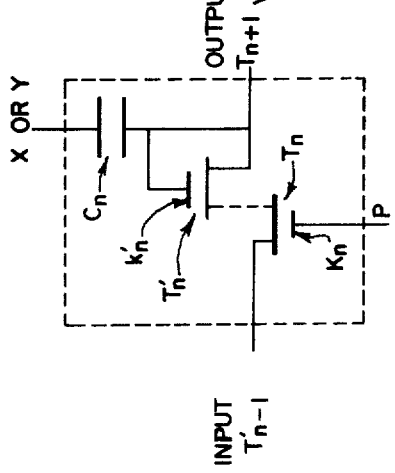
FIG. 2

INTEGRATED SHIFT REGISTER

BACKGROUND OF THE INVENTION

The present invention concerns an integrated shift register with very low power consumption. Such a register is particularly well suited, though this does not constitute its only field of application, to the construction of a frequency divider circuit usable in any type of small-sized portable device, powered by a battery which is required to ensure the unit's supply with a life time of up to several years. As is known, the problem of energy consumption occurs most acutely when the frequency to be divided is high, even a few MHz, as is the case, for example, in high chronometric performance watches.

Attempts have been made to reduce energy consumption in frequency dividers by using C-MOS integrated binary circuits. Most quartz watches are now equipped with such circuits. In this instance, consumption is essentially determined by the charging and discharging of capacitors presented by each stage of the shift register and with the periodicity of its output signal. Each stage's consumption is consequently proportional to the value of its capacitors and to the frequency of its output signal. For a high frequency quartz watch, then, it is consequently the first stages, that is to say, those dividing the highest frequencies, which are determinative of the power consumption of the electronics. In order to lower the capacitances of these stages, various manufacturing techniques, such as those known by the name of Si-gate or SOS (Silicon on sapphire) have been used. However, to keep power consumption within acceptable limits, the dimensions of the integrated circuits have to be reduced to such a point that, in the current state of the art, the cost of their manufacture becomes prohibitive.

High frequency dividers with a large part of their capacitors forming part of a resonant circuit have also been proposed to lower power consumption. A system of this type, for example, is described in Swiss Pat. No. 558,111. In this instance, the energy stored periodically in the capacitors is recovered. The system makes use of a shift register of a known type, realized in integrated form and designated an IGFET (insulated gate FET) bucket brigade register. This register is ring connected and a single charge packet is transferred from one cell to the other. Each cell comprises firstly two IGFET's which are connected in series, and two capacitors connected between the respective transistor control electrodes and drains. The control electrodes are connected alternately to two lines supplied by a push-pull quartz oscillator supplying alternating voltages in phase opposition. Means also are provided to bias the crystalline substrate in which the circuits are integrated. The register cell presents a low load for the oscillator and the reactive current due to this capacitance causes a very small loss in the quartz. The largest part of the power which the oscillator has to supply is that dissipated in the transistor through which the transfer of the charge from one stage (half-cell) to the other is made.

The mode of operation of the shift register described above (and a detailed explanation of which is to be found in the article of C. N. Berglund et al, "Fabrication and Performance Considerations of Charge-Transfer Dynamic Shift Registers," Bell System Technical Journal, Vol. 51, No. 3, March 1972) is such that the current goes through the transistor for about ¼ period and the source-drain voltage of the latter changes during this time from practically the value $V_P$ to 0, $V_P$ being the peak-to-peak value of the phase supply voltage supplied by the oscillator. Consequently, the power supplied by the oscillator expressed by the general relation:

$$P_t = \frac{2}{T} \int_0^{T/2} i_D(t) \cdot v_{SD}(t) \, dt,$$

in which $i_D(t)$ and $v_{SD}(t)$ are instantaneous values respectively of the drain current and of the source-drain voltage of the transistor, T being the oscillation period, then becomes:

$$P_T = (V_p + v_m)^2 \cdot c \cdot f.$$

In this expression, C is the capacitance, associated with the transistor, f is the oscillator frequency, and $v_m$ represents the average control voltage which exceeds the transistor threshold voltage. The voltage $v_m$ is normally a few tenths of volt, while $v_p$ is a few volts.

By taking a typical example with the values:
$V_P = 2$ V, $v_m = 0.3$ V, $C + 0.1$ p F, and $f = 4.2$ MHz, a value of 2.2 $\mu$W is obtained for $P_T$.

The power supplied by the oscillator is consequently relatively high because of the high voltage necessary for the transfer of the charge packet from one cell of the register to the other.

BRIEF SUMMARY OF THE INVENTION

The principal object of the present invention is to provide a shift register necessitating a very low voltage for charge transfer, which considerably reduces the power which has to be furnished by the oscillator.

According to the present invention, there is provided a shift register comprising a plurality of transistors and capacitors which are integrated in a semi-conductor substrate and form a plurality of cells connected one after the other, each cell comprising two identical stages connected in series and capable of being supplied by respective ones of two periodic signals in phase opposition, wherein each stage comprises an MOS transistor structure which has two principal electrodes forming respectively the input and output of the stage, and two control electrodes, one of which is connected, in use, to a bias source and the other of which is connected to the output electrode, and a capacitor, one plate of which is connected to said output electrode and the other plate of which receives, in use, one of the said periodic signals, depending on the position of the stage in the register.

According to one advantageous embodiment of the invention, the transistor structure comprises a MOS transistor with two control electrodes. Alternatively, this structure can comprise two MOS transistors in series.

The MOS transistor structure and the capacitor of each stage of the register preferably are formed by a first and second semi-conductor region of a type opposite to that of the subtrate in which they are integrated, a first insulated conductor layer beginning above the first region and stopping substantially halfway between the first and second region, a second insulated conductor-layer substantially beginning halfway between the first and the second region and stopping above the second region, a third conductor layer in contact with the second region and connected to the second conductor layer, and a fourth insulated conductor layer disposed opposite the second region.

The two semi-conductor regions form the principal electrodes of the structure whose first and second conductor layers form the control electrodes, and the fourth conductor layer forms a plate of said capacitor whose second plate is formed by the second region.

As will appear more clearly in the description, the shift register which has just been briefly defined requires only a very low voltage for transferring its charge from one cell to the next. This considerably reduces the power which has to be supplied by the oscillator producing the two signals in phase opposition. As also appears later, the signals obtained on the various cells of the register are particularly well suited to the realization of very low consumption frequency dividers.

BRIEF DESCRIPTION OF THE DRAWINGS

The invention will be described in more detail, by way of example, with reference to the accompanying drawings, in which:

FIG. 1 partially represents a shift register embodying one illustrative embodiment of the invention in schematic cross-section.

FIG. 2 gives the equivalent diagram of a stage of the illustrative register of FIG. 1; and FIG. 3 is a diagram serving to explain the functioning of the illustrative register of FIG. 1.

DETAILED DESCRIPTION OF THE PREFERRED EMBODIMENT

Reference will first be made to FIG. 1 in which an MOS structure has been represented which comprises a p type crystalline substrate, for example, in which five n type regions are integrated, respectively designated M′, $Z_0$, $Z_{00}$, $Z_1$ and $Z_2$.

The whole is covered by an insulating layer I locally interrupted above part of the regions M′, $Z_{00}$, $Z_1$ and $Z_2$ to allow deposition, directly on the n region concerned, of contacts m, $a_0$, and a and b respectively.

The insulating layer I has deposited thereon a number of electrodes, designated respectively k, k′, $k_1$, $k'_1$, $k_2$ and $k'_2$, which principally extend above the p region. More precisely, the electrode k extends between the ends of the region M′ and $Z_0$, while the electrode k′ extends from the end of the region $Z_0$ to the beginning of the region $Z_{00}$ where it is electrically connected to the contact $a_0$ already mentioned. The electrode $k_1$ begins at the end of the region $Z_{00}$ to stop virtually halfway between $Z_{00}$ and $Z_1$, partially overlapping the electrode $k'_1$ which extends up to the beginning of the region Z, where it is electrically connected to the contact a. Where the electrode $k_1$ overlaps the initial part of the electrode $k'_1$ it is insulated therefrom by an insulating layer i. The electrodes $k_2 - k'_2$ are disposed between the regions $Z_1$ and $Z_2$ in the same way as the electrodes $k_1$ and $k'_1$.

Finally, the insulating layer I has thereon conducting deposits or electrodes $c_0$, $c_1$, $c_2$, which extend above the regions $Z_{00}$, $Z_1$, and $Z_2$ respectively. The electrode k is the electrode intended to receive the enabling signal through which a new charge packet is introduced into the register. This electrode is connected to an input terminal E.

The register is controlled by a push-pull oscillator (not illustrated), such as that described, for example, in Swiss Pat. No. 580,837, which supplies on the lines X and Y two sinusoidal voltages in phase opposition $\phi_1(t)$ and $\phi_2(t)$ respectively. The electrodes $c_0$, $c_1$ and $c_2$ are alternately connected to the lines X and Y. Additionally, the oscillator biases, by means of a voltage multiplier (not illustrated), such as that described, for example, in Swiss Pat. No. 553 481, the crystalline substrate of the unit negatively in relation to a reference ground M′ to which are connected, by a line P, the electrodes m, $k_1$, and $k_2$.

Thus, it is apparent from the present description and drawing that the integrated circuit in FIG. 1 is formed of an assembly of capacitors and MOS transistors. The electrodes $c_0$, $c_1$ and $c_2$ in fact comprise the plates of the capacitors $C_0$, $C_1$ and $C_2$, respectively, whose other plates are formed by the regions $Z_{00}$, $Z_1$ and $Z_2$, respectively. Additionally, the electrode k comprises the control electrode of an MOS transistor $T_0$ whose region M′ is the source and whose region $Z_0$ is the drain. As for the electrode k′, it comprises the control electrode of an MOS transistor $T'_0$, whose region $Z_0$ is the source and whose region $Z_{00}$ is the drain. Because of the connection between k′ and the contact $a_0$, this transistor consequently has its control electrode connected to its drain.

It can be seen that the pair of electrodes $k_1 - k'_1$ comprise the control electrodes of respective component parts $T_1 - T'_1$ of a double transistor structure whose region $Z_{00}$ comprises the source and whose region $Z_1$ comprises the drain. Because of the connection of the contact a with $k'_1$, the transistor $T'_1$ has its control electrode connected to its drain. Exactly the same is true of the pair $k_2 - k'_2$ which comprise the control electrodes of the respective parts $T_2 - T_{o2}$ of a double transistor structure whose regions $Z_1$ and $Z_2$ respectively comprise the source and the drain. The region $Z_2$ also comprises the source of the subsequent transistor structure, identical to the structures $T_1 - T'_1$ and $T_2 - T'_{2'}$ the beginning of the first electrode only of which, connected to the line P, has been represented in FIG. 1.

The circuit represented in FIG. 1 includes the injection or enabling stage as well as the first cell of a shift register. The injection stage is formed by the capacitor $C_0$ and the transistors $T_0$ and $T'_0$, while the first cell of the register is formed of two identical stages in series, the first formed by the capacitor $C_1$ and the double MOS structure $T_1 - T'_1$ and the second by the capacitor $C_2$ and the double MOS structure $T_2 - T'_2$.

A shift register according to the illustrative embodiment of the invention consequently will comprise a plurality of cells similar to that in FIG. 1 and connected one after the other with their control electrodes to the bias line P and their two capacitors respectively connected to the line X as regards the first stage and the line Y as regards the second.

Reference will now be made to FIG. 2 in which has been represented the equivalent diagram of a stage of an illustrative shift register according to the invention. Thus, this register comprises a capacitor $C_n$ and a double transistor structure whose two components $T_n$ and $T'_n$ have for control electrodes $k_n$ and $k'_n$ respectively. This double structure is represented in FIG. 2 by two transistors connected by a dotted line which symbolizes the region common to the drain of $T_n$ and the source of $T'_n$. The control electrode $k_n$ of $T_n$ is connected to the bias line P and its source is connected to the output of the preceding stage, formed by the drain of the second transistor $T'_n - 1$ of the latter. One of the plates of the capacitor $C_n$ is connected to the line X or to the line Y according to whether the stage is the first or second, respectively, of the cell concerned. The other plate of $C_n$ is connected both to the drain and to the control electrode $k'_n$ of $T'_n$. The output of the stage, comprising the drain of the transistor $T'_n$, is connected to the output of the following stage, formed by the source of the first transistor, $T_{n+1}$ of the latter.

With reference now to FIGS. 1 and 2, as well as to the explanatory diagram in FIG. 3, the functioning of the illustrative shift register according to the invention can be described as follows. With a view to simplification, the MOS structure threshold voltages will be taken to be O. The crystal being negatively biased in relation to the ground and the two lines X and Y being supplied by sinusoidal voltages in phase oppositions $\phi_1$(t) and $\phi_2$(t) respectively, if the transistor $T_0$ is blocked, sinusoidal voltages $v_a$ and $v_b$ (with peak-to-peak value $V_a$ and $V_b$ respectively) appear on the regions $Z_1$ and $Z_2$ at the points a and b respectively. The form of these two voltages is represented in the diagram in FIG. 3. If the transistor $T_0$ is then controlled, between the instants $t_0$ and $t_i$, by application to its control electrode k (terminal E) of a pulse derived from the voltage $\phi_2$ (t), electrons pass, in the interval $t_0 - t_1$, from the reference region M' to the regions $Z_0$ and, from there, via the transistor $T'_0$, to the region $Z_{00}$. The capacitor $C_0$ is thus charged on the peak value of $\phi_2$(t). At the instant $t_1$, the potential of the region $Z_{00}$ in relation to M' is consequently O for all practical purposes.

The potential at the point $a_0$ then assuming a negative value in relation to M', the transistor $T'_0$ is blocked since its control electrode k' is connected to the region $Z_{00}$. The electrons consequently pass to the region $Z_1$ via the MOS structure $T_1 - T'_1$ and charge the capacitor $C_1$ on the peak value of $\phi_1$ (t). During the following half-period, that is to say, between the instants $t_2$ and $t_3$, the same procedure is repeated for the transfer between the regions $Z_1$ and $Z_2$, via the MOS structure $T_2 - T'_2$, of the charge packet $Q = C_1 \cdot \phi_1$, and so forth. If the value of the reactance $1/WC_1 = 1/WC_2$ (W being the pulsatance of the oscillator) is far greater than the value of the differential resistance presented by the MOS structure of a stage, the current which has to be supplied by the oscillator for the charge packet transfer is substantially sinusoidal and out of phase by almost 90° in relation to the phase voltages $\phi_1$ (t) and $\phi_2$ (t). The source-drain voltage of the MOS structure, which is this case also represents its control voltage, becomes very low for this transfer. The power which the oscillator has to supply is itself consequently very low.

Analysis, expressed in the same terms as those used previously for a shift register of the "IGFET bucket brigade" type, shows that the power to be supplied by the oscillator for the charge packet transfer is then $P_T = 1.8 \, V_p \, v_m \cdot C \cdot f$.

Taking the same typical values as previously described a power of 0.45 $\mu w$ is obtained. This power was 2.2 $\mu w$ with the "IGFET bucket brigade" register. It is thus clear that the shifts register made and operated according to the invention allows a considerable saving of power to be achieved.

As FIG. 3 shows, the voltage $v_a$ which is established at the point a between the instants $t_1$ and $t_2$ on the transfer of the charge by the MOS structure $T_1 - T'_1$ and then between the instants $t_2$ and $t_3$ on transfer by $T_2 - T'_2$ is very low in relation to the voltage which is established when no transfer occurs. The same is true of the voltage $v_b$ at the point b between the instants $t_2$ and $t_3$, and then between the instants $t_3$ and $t_4$ when the charge passes through the following MOS structure. Because of this difference, the shift register according to the invention is particularly well suited to the realization of frequency divider circuits. One such circuit is described, for example, in the copending patent application for "Integrated Frequency Divider" filed by the Applicant on the same filing date as the present application.

A shift register made according to the invention can be realized by use of the manufacturing technique known by the name of Si-gate. Those skilled in the art understand that a simpler technique called Al-gate can, of course, also be used. In this second instance, the structure of a stage comprises two MOS transistors in series. However, owing to the capacitance presented by the floating junction then forming the drain of the first transistor and the source of the second transistor, the register's performance runs the risk of being slightly diminished, in the sense essentially that the possible number of cells is lower than if the structure represented in the illustrative embodiment FIG. 1 is used. This is due to a certain loss of charge when it is transferred from one capacitor to another.

The register's injection stage, incidentally, instead of comprising two transistors in series, can be identical to a stage of the register and consequently comprise only two n regions, M' and $Z_{00}$.

While the invention has been illustrated and described as comprising one or more preferred embodiments, it is not intended to be limited to the details shown, since various modifications and changes may be made by those skilled in the art without departing from the spirit of the invention as disclosed and claimed herein.

What is claimed is:

1. A shift register comprising a plurality of transistors and capacitors which are integrated in a semiconductor substrate and form a plurality of cells connected one after the other, each cell comprising two identical stages connected in series and capable of being supplied by respective ones of two periodic signals in phase opposition, wherein each stage comprises an MOS transistor structure which has two principal electrodes forming respectively the input and output of the stage, and two control electrodes, one of which is connected, in use, to a bias source and the other of which is connected to the output electrode, and a capacitor, one plate of which is connected to the said output electrode and the other plate of which receives, in use, one of said periodic signals.

2. A shift register according to claim 1 wherein said transistor structure includes a MOS transistor with two control electrodes.

3. A shift register according to claim 1, wherein said transistor structure includes two MOS transistors connected in series.

4. A shift register according to claim 2, wherein the transistor structure and the capacitor of one stage are formed by first and second semi-conductor regions of a type opposite to that of the substrate in which they are integrated, a first insulated conductor layer beginning above the first region and stopping substantially halfway between the first and second region, a second insulated conductor layer beginning substantially halfway between the first and second region and stopping above the second region, a third conductor layer in contact with said second region and connected to the second conductor layer, and a fourth insulated conductor layer disposed opposite the second region, the two semi-conductor regions forming the principal electrodes of the transistor structure, the first and second conductor layers of which form the respective control electrodes, and the fourth conductor layer forming one plate of the capacitor whose other plate is formed by said second region.

5. A shift register according to claim 4, wherein said first and second semi-conductor regions also respectively form the second semi-conductor region of the preceding stage and the first semi-conductor region of the following stage.

6. A shift register comprising a plurality of cells connected one after the other, each cell having two identical stages connected in series and capable of being supplied by respective ones of two periodic signals in phase opposition, wherein each stage comprises means having two principal electrodes forming respectively the input and output of the stage, and two control electrodes, one of which is connected, in use, to a bias source and the other of which is connected to the output electrode, and a capacitor, one plate of which is connected to the said output electrode and the other plate of which receives, in use, one of said periodic signals.

* * * * *